US008557628B2

(12) United States Patent
Wang

(10) Patent No.: US 8,557,628 B2
(45) Date of Patent: Oct. 15, 2013

(54) METHOD FOR PRODUCTION OF ZINC OXIDE SINGLE CRYSTALS

(75) Inventor: Shaoping Wang, Brookfield, CT (US)

(73) Assignee: Fairfield Crystal Technology, LLC, New Milford, CT (US)

(*) Notice: Subject to any disclaimer, the term of this patent is extended or adjusted under 35 U.S.C. 154(b) by 0 days.

(21) Appl. No.: 13/252,601

(22) Filed: Oct. 4, 2011

(65) Prior Publication Data

US 2012/0086001 A1   Apr. 12, 2012

Related U.S. Application Data

(60) Provisional application No. 61/390,650, filed on Oct. 7, 2010.

(51) Int. Cl.
H01L 21/00 (2006.01)
C30B 28/12 (2006.01)

(52) U.S. Cl.
USPC ............................... 438/104; 117/84

(58) Field of Classification Search
CPC ........ C30B 25/02; C30B 23/02; C30B 23/00; H01L 29/7869; H01L 21/02554; H01L 21/02565
USPC .............. 438/104, 478, 483, 767; 117/84, 88, 117/200
See application file for complete search history.

(56) References Cited

U.S. PATENT DOCUMENTS

| 5,900,600 A | 5/1999 | Alexander et al. | |
|---|---|---|---|
| 7,279,040 B1 | 10/2007 | Wang | |
| 2005/0000406 A1* | 1/2005 | Janzen et al. | 117/81 |
| 2011/0030611 A1* | 2/2011 | Santailler et al. | 117/108 |

FOREIGN PATENT DOCUMENTS

WO   WO2009/125009   * 10/2009

OTHER PUBLICATIONS

D Look, "Donors and Acceptors in Bulk ZnO Grown by the Hydrothermal, Vapor-Phase, and Melt Processes," Mater. Res. Soc. Symp. Proc. vol. 957, 2007 Materials Reseach Society, electronic version 0957-K08-05, Dec. 2007.
D.C. Look, "Recent Advances in ZnO Materials and Devices," Mater. Sci. Eng. B80, 2001, pp. 383-387, Apr. 2001.
E.S. Hellman, "Growth of Ga-face and N-face GaN films using ZnO Substrates," MRS Internet J. Nitride Semicond. vol. 1, Article 16, electronic version 1996, Oct. 2006.
N. Sakagami, "Hydrorthermal Growth and Characterization of ZnO Single Crystals of High Purity," Journal of Crystal Growth 99, 1990, pp. 905-909, Nov. 1990.
C. Neumann, "Surface Preparation of Single Crystals for ZnO Homoepitaxy," Mater. Res. Soc. Symp. Proc. vol. 957, 2007, Materials Research Society, electronic version 0957-K07-31, Nov. 2007.
J. Nause, "Pressurized Melt Growth of ZnO Boules," Semicond. Sci. Technol. 20 No. 4, Apr. 2005, S45-S48.
D. Schulz, "Melt Grown ZnO Bulk Crystals," Mater. Res. Soc. Symp. Proc. vol. 1201, 2010, Materials Research Society, electronic version 1201-H06-10, Nov. 2010.
A. Janotti, "Fundamentals of Zinc Oxide as a Semiconductor," Rep. Prog. Phys. 72, 2009, 126501 29 pp., Jul. 2009.

(Continued)

Primary Examiner — Nikolay Yushin
(74) Attorney, Agent, or Firm — MKG, LLC

(57) ABSTRACT

The disclosed subject matter includes a method of producing zinc oxide (ZnO) single crystals in an enclosure. The ZnO single crystals have a low concentration of lithium and hydrogen impurities.

19 Claims, 4 Drawing Sheets

(56) References Cited

OTHER PUBLICATIONS

K. Maeda, "Growth of 2 Inch ZnO Bulk Single Crystal by the Hydrothermal Method," Semicond. Sci. Technol. 20 No. 4, Apr. 2005, S49-S54.

D. Hwang, "ZnO Thin Films and Light-Emitting Diodes," J. Phys. D. Appl. Phys. 40, 2007, R387-R412, Nov. 2007.

J. Rojo, "Physical Vapor Transport Crystal Growth of ZnO," Zinc Oxide Materials and Devices, Proc. of SPIE vol. 6122, 61220Q, Nov. 2006.

U. Ozgur, "A Comprehensive Review of ZnO Materials and Devices," Journal of Applied Physics 98, 041301, Apr. 2005.

* cited by examiner

METHOD FOR PRODUCTION OF ZINC OXIDE SINGLE CRYSTALS

CROSS REFERENCE TO RELATED APPLICATIONS

This application claims priority to U.S. Provisional Patent Application Ser. No. 61/390,650 for "Method for Production of Semiconductor Zinc Oxide Single Crystal" filed on Oct. 7, 2010, the entirety of which is incorporated by reference herein.

U.S. GOVERNMENT RIGHTS

This invention was made with government support under Small Business Innovation Research Grant No. IIP-0943961 awarded by the National Science Foundation. The government has certain rights in the invention.

BACKGROUND

Zinc oxide (ZnO) has a wide band gap, high stability and high thermal operating range that make it a suitable material as a semiconductor for fabrication of variety of semiconductor devices. ZnO single crystal is also a substrate material for epitaxial growth and fabrication of gallium nitride (GaN) and III-nitride devices. In order to manufacture these semiconductor devices, the ZnO is provided as large single crystal boules that are further sliced into wafers. The ZnO wafers will then be polished to make ZnO substrates.

A ZnO substrate is used for epitaxial growth of thin films. A thin film grown on a ZnO substrate may be a contiguous thin film, a nano-structure, or a mixture of the two. The materials of thin films that can be grown on ZnO substrates are metal-oxide compounds, including but not limited to, ZnO, CdO, MgO, BeO, $Zn_xMg_{1-x}O$ (where $0<x<1$), $Zn_xCd_{1-x}O$ (where $0<x<1$), $Zn_xBe_{1-x}O$ (where $0<x<1$), and III-nitride compounds, including but not limited to, GaN, InN, AlN, $In_xGa_{1-x}N$ (where $0<x<1$), $Al_xGa_{1-x}N$ (where $0<x<1$).

Semiconductor devices that can be made using the thin films of metal oxides or III-nitrides grown on ZnO substrates include, but not limited to, light emitters, such as UV, visible light emitting diodes (LEDs) and laser diodes (LDs), UV photodetectors, high-frequency/RF devices, such as high electron mobility transistors (HEMTs), high-power devices, such as Schottky diodes, PIN diodes, power transistors, high-temperature devices, spintronics devices, radiation detector devices, chemical sensors, surface acoustic devices, and integrated circuits (ICs), etc.

To make semiconductor devices with high performance characteristics, it is important to provide ZnO substrates with low dislocation densities. For some devices, it is desirable to use n-type ZnO substrates with a low electrical resistivity, preferably less than 0.1 ohm-cm, i.e., low resistivity n-type ZnO substrates. For other devices, it is desirable to use p-type ZnO substrates with a low electrical resistivity, preferably less than 0.1 ohm-cm, i.e., low resistivity p-type ZnO substrates. Yet, for some other devices, particularly high-frequency or RF devices, it is desirable to use ZnO substrates with a high electrical resistivity. Therefore, it is desirable that a growth method for producing ZnO single crystal boules is capable of producing all three types of ZnO crystal boules, i.e., n-type low resistivity ZnO crystal boules, p-type low resistivity ZnO crystal boules, and semi-insulating or insulating ZnO crystal boules.

An n-type ZnO single crystal boule with a low resistivity is produced by doping with an n-type dopant (e.g., B, Al, Ga, In, Cl, Br, Ti, etc.) during the crystal growth process. Similarly, a p-type ZnO single crystal boule with low resistivity is produced by doping with a p-type dopant (e.g., P, As, Sb, Na, K, Ag, etc.) during the crystal growth process. A semi-insulating or insulating ZnO crystal boule with a high resistivity can be produced in two ways: (1) maintaining a high purity during the crystal growth process so that a ZnO crystal boule with low concentrations of residual electrically active impurities, and (2) doping ZnO a small amount of an dopant opposite type of the residual impurities or a deep level impurity (usually a transition metal element, such as Sc, V, Fe, etc.) to compensate the residual impurities.

A ZnO single crystal can be unintentionally doped by impurities in a ZnO crystal growth system due to residual impurities in the source materials or contamination from crystal growth furnace components and medium surrounding the growing crystal boule. Therefore, it is desired to maintain a low concentration of impurities in a ZnO crystal growth process.

ZnO bulk single crystals of large sizes (greater than 1 inch in diameter) were demonstrated by using the following three techniques: (1) chemical-assisted vapor transport (CVT) technique, (2) hydrothermal technique and (3) high-pressure melt growth technique. The characteristics of these three techniques are discussed as follows:

CVT Technique

In a CVT growth of ZnO crystals, a ZnO source material in the source zone is reacted with a chemical transport agent (e.g., $H_2$, $H_2O$) and then transported to the growth zone with a ZnO crystal seed so that a ZnO crystal boule is grown. A CVT growth of ZnO crystals is usually carried out in fused silica vessel in a resistively heated growth furnace in the temperature range of 1000-1200° C. An example of CVT growth process for ZnO single crystals is the one developed at Eagle-Picher (later on at ZN Technology, Inc.), and ZnO wafers up to 2-inch in diameter with reasonably good quality were demonstrated.

A drawback of a CVT growth process is the extremely low growth rates (2-3 mm/day, or ~0.1 mm/hr), which does not facilitate volume production of ZnO single crystals and wafers. In addition, contamination of Si (an n-type dopant in ZnO) from fused silica ($SiO_2$) makes it difficult to produce p-type and semi-insulating ZnO crystals. Finally, it is found that hydrogen is an impurity known to be both an n-type impurity when at a substitutional site and an impurity passivating a p-type dopant by forming a complex with a p-type dopant, thus reducing free carrier concentration and increasing electrical resistivity. As a result, incorporation of hydrogen (H) from the chemical transport agent during CVT growth makes it difficult to produce a reliable and stable p-type and semi-insulating ZnO crystals.

Hydrothermal Technique

Since ZnO is highly soluble in water at high temperatures (300-400° C.), single crystal ZnO can be grown using a hydrothermal growth process, similar to that used to grow quartz single crystals. Hydrothermal growth is a potential contender for commercial volume production of ZnO single crystals for semiconductor wafers. However, there are several drawbacks in hydrothermal growth of ZnO. First, the growth rate is very low, in the range of 0.1-0.2 mm/day (about 0.004-0.008 mm/hr) in the c-axis direction. A (0001) ZnO crystal boule of 20 mm in thickness will take about 100 days to grow, which is considered to be a long cycle time. This problem may be mitigated by scaling up the hydrothermal growth setup to produce large number of single crystals boules per run. The scale-up effort, however, is both lengthy and costly. In addition, a platinum (Pt) metal crucible is used in hydrothermal growth of ZnO, which adds a significant cost to the crystal production.

Another drawback is that hydrothermal-grown ZnO crystals contain large amounts of lithium (Li) and potassium (K) (from LiOH and KOH used in hydrothermal growth solution). These alkaline metal elements are known to be p-type dopants and hence contribute to p-type conductivity, which reduces n-type carrier concentrations and therefore leads to a higher resistivity in an n-type ZnO crystal. Since Li is a fast diffusion ion in a ZnO crystal, out-diffusion of Li from hydrothermal-grown ZnO crystal substrates to the epitaxial thin films during epitaxial growth make it difficult to produce sharp p-n junctions and therefore detrimental to device performances.

A third drawback includes hydrogen (H) contamination in hydrothermal grown ZnO crystals makes it difficult to produce p-type and semi-insulating ZnO crystals, which similar to the situation in CVT growth technique.

Finally, due to the high growth-rate anisotropy inherent in hydrothermal growth technique, it is difficult to grow large-diameter ZnO crystal boules with an orientation other than the [0001] orientation. As a result, it is difficult to produce large diameter ZnO boules in non-polar directions in an efficient manner using a hydrothermal technique.

Melt Growth Technique

Since ZnO melts at 1975 degrees Celsius (° C.), in principle, it can be grown from its melt. Melt growth techniques have many advantages, such as a high growth rate (>5 mm/hr), the flexibility to grow in any crystal orientation, and the ease to dope the crystals to achieve a desired electronic characteristic. However, ZnO sublimes/dissociates at the melting point and the dissociation pressure of ZnO at its melting point is very high (~1.07 atmospheres) making the melt growth difficult to manage. Therefore, a high-pressure (>20 atm) oxygen gas is required to suppress evaporation and dissociation.

Another difficulty in ZnO melt growth is that only iridium crucible can be used to directly contain ZnO melt. To avoid using a refractory metal crucible to directly contain a ZnO melt, a so-called "skull-melting" (or "cold-crucible") technique was developed to hold ZnO melt and demonstrated ZnO crystals boules of over 1-inch in diameter. It appears that controlling of ZnO crystal growth using a "skull-melting" technique is challenging because of the complexity of the process. More importantly, seeded growth in a "skull-melting" appears to be difficult. In another development, a Bridgman melt growth of ZnO crystals in an iridium (Ir) metal crucible to contain the ZnO melt at a high pressure under a gas mixture of $CO_2$ and $O_2$ was investigated and ZnO single crystal boules over 1 inch in diameter were demonstrated. Drawbacks of the technique include: (1) the difficulty in controlling the growth process, (2) a severe degradation of Ir crucible, and (3) the contamination of carbon from the gas mixture.

Since ZnO sublimes appreciably at temperatures higher than 1500° C., a physical vapor transport (PVT) growth can be used to grow ZnO single crystals at temperatures higher than 1500° C. A PVT growth is a sublimation and re-condensation process. In U.S. Pat. No. 7,279,040, a PVT growth technique for producing ZnO single crystals at a temperature range of 1300-1800° C. is described. The advantages of a PVT growth for ZnO include the ease to control the growth process and the low cost. However, a PVT growth requires a suitable crucible and a thermal insulation setup. Crucibles made of oxides, such as alumina (a ceramic containing 99.0-99.8% $Al_2O_3$) or sapphire ($Al_2O_3$), were found to react with Zn vapor at high temperatures, which not only limits the growth temperature to no greater than about 1550° C. but also limits the growth rate to less than 0.2 mm/hr or even lower. In addition, because aluminum (Al) from an $Al_2O_3$-based crucible is an n-type dopant in ZnO, a PVT using an Al2O3-based ceramic crucible limits the growth to only n-type ZnO crystals.

There exists a need of a growth technique for producing ZnO single crystals that overcomes the inadequacies of these three techniques discussed above.

SUMMARY

In one aspect, the invention is directed to a method for growing a zinc oxide (ZnO) single crystal boule within an interior of a physical vapor transport (PVT) furnace system, the method comprising the steps of: placing a ZnO source material inside a first end of an iridium metal crucible and placing a ZnO seed in a second end of the iridium metal crucible wherein the ZnO seed and a surface of the ZnO source material facing the ZnO seed are separated at a predetermined distance; placing the iridium metal crucible containing the ZnO seed and the ZnO source material in a thermal insulation setup; heating the iridium metal crucible containing the ZnO seed and the ZnO source material to a predetermined temperature to obtain a temperature distribution such that the temperature of the ZnO source material ($T_1$), is higher than the temperature of the ZnO seed ($T_2$), wherein $T_2$ is in a range from about 1500° C. to about 1900° C.; maintaining the pressure of the interior of the PVT furnace system by flowing a gas mixture through the interior of the PVT furnace system; and maintaining the temperature distribution within the iridium metal crucible to cause growth of the ZnO single crystal boule on the ZnO seed.

In another aspect, the invention is directed to a ZnO wafer made from a ZnO single crystal boule made by the method described above.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
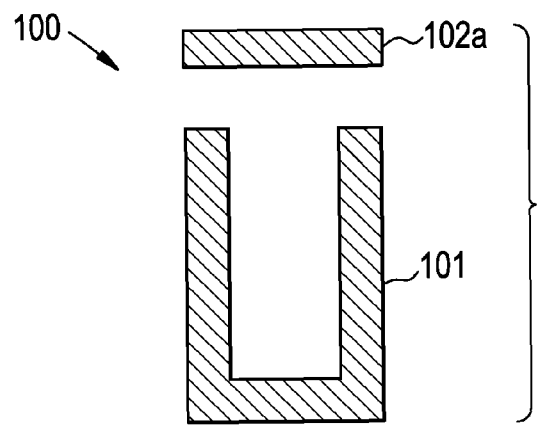
FIG. 1 is a cross-sectional view of an iridium metal crucible for PVT growth of a ZnO single crystal boule.

The invention relates to a physical vapor transport (PVT) method and a furnace setup for producing ZnO single crystal boules. More specifically, the invention is directed to a method of growing ZnO single crystals in a iridium metal crucible (referred to as "an enclosure") in a temperature range between about 1500 degrees Celsius (° C.) to about 1900° C. within a thermal insulation setup made of refractory metal-oxide-based materials.

The crystal growth rates using the methods described herein may exceed 1.0 mm/hr. ZnO single crystal boules produced using the methods described herein have a low concentration of lithium (Li) impurity (no greater than $1 \times 10^{16}$ atoms/cm$^3$) and a low concentration of hydrogen (H) impurity (no greater than $1 \times 10^{17}$ atoms/cm$^3$).

In another embodiment, this invention allows growth of ZnO single crystal boules of not only an n-type conduction, but also a p-type conduction and a high resistivity (semi-insulating or insulating, i.e. a resistivity larger than $1 \times 10^4$ ohm-com).

In yet another embodiment, ZnO single crystals produced through using the methods disclosed herein have average dislocation densities less than $10^3$ cm$^{-2}$. In another embodiment, a ZnO single crystal produced is dislocation-free. ZnO single crystals produced using this invention are used for fabrication of oxide-based (e.g. ZnO, ZnCdO, ZnMgO) semiconductor devices, including, but not limited to, light emitting diodes (LEDs) and, laser diodes (LDs). ZnO single crystals produced using the methods disclosed herein are used for fabrication of III-nitride-based (e.g. GaN, InGaN, AlGaN) semiconductor devices, including, but not limited to, light emitting diodes (LEDs) and, laser diodes (LDs).

More specifically, the disclosed subject matter relates to an iridium metal crucible (also referred to as an enclosure) and a thermal insulation setup made of refractory-oxide-based insulation materials suitable for a PVT growth of ZnO single crystal boules in the temperature range of 1500-1900° C.

In order to carry out a PVT growth of ZnO single crystal boules in the temperature range of 1500-1900° C., a suitable crucible and a thermal insulation setup (also called a "hot zone") are needed.

Iridium Metal Crucible

Iridium (Ir) metal can be used to make a crucible. Iridium is one of the platinum group metals. Iridium can be used in an air or oxygen gas environment at a temperature above 1600° C. Iridium is more affordable than platinum (Pt) or rhodium (Rh), and is available in sheet form.

Iridium crucibles of various shapes can be made by welding iridium metal sheets together. An iridium crucible loses weight in the presence of oxygen gas at high temperatures (1500° C. or above) due to formation of volatile iridium oxides. Since oxidation of iridium metal is proportional to temperature, iridium crucibles employed in a PVT growth of ZnO crystals according to this invention can last a long time because the growth temperature (in the range of 1500-1900° C.) described herein is significantly lower than the growth temperature in a melt growth of ZnO, which is greater than 2000° C.

The robustness of iridium crucibles in a PVT growth according to this invention contributes to the low production cost for ZnO single crystal boules and wafers. FIG. 1 shows a schematic drawing of an iridium crucible 100 for PVT growth of a ZnO single crystal boule, where the iridium crucible 100 includes a crucible body 101 and lid 102a.

Thermal Insulation Setup—"Hot Zone"

Thermal insulation materials compatible with the iridium crucible, Zn vapor, and O$_2$ at high temperatures, e.g., temperatures greater than 1300° C., facilitates ZnO crystal growth in a PVT furnace using an iridium crucible 100. Thermal insulation materials are utilized to form a crucible-and-thermal-insulation package 200, shown in FIG. 2, which is hereinafter referred to as a "hot-zone".

Figure 2:
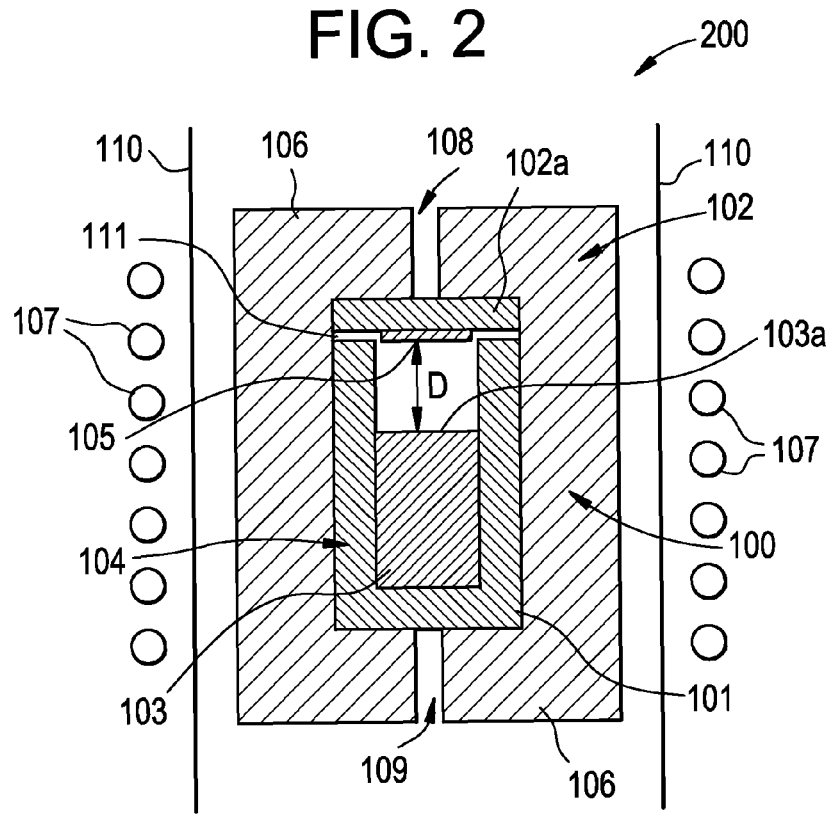
FIG. 2 is a schematic drawing of a ZnO PVT growth setup (the "hot zone") using an iridium crucible within an inductively heated furnace.

FIG. 2 illustrates a design of a "hot zone" in an inductively heated furnace. In this embodiment, an iridium metal crucible 100 has a body 101 and a first end 102 having a lid 102a. A ZnO source material 103 is placed in a second end 104 of the crucible 100 and a ZnO seed 105 is placed on the lid 102a.

The ZnO seed 105 and a surface 103a of the ZnO source material 103 that is facing the ZnO seed are separated by a first distance D. The first distance D is greater than 5 millimeters (mm).

The crucible 100 is surrounded by a thermal insulation 106 made of refractory metal-oxide materials. Examples of metal-oxide materials for making the thermal insulation 106 surrounding the iridium crucible 100 include $Al_2O_3$-fiber-based thermal insulation materials, such as Type Sali-2, Type Sali, Alumina Mat, all made by Zircar Ceramics, Inc., Florida, NY, USA, $Al_2O_3$ powder, $ZrO_2$ powder, $Y_2O_3$ powder. A "hot zone" made with these insulation materials is suitable for a PVT growth of ZnO crystals in an inert gas (e.g., Ar, $N_2$, He) or an oxygen-containing gas (e.g., $O_2$, air) environment at a temperature of up to about 1900° C.

The iridium crucible 100 also serves as the susceptor for induction (RF) power input through induction coils 107.

The temperatures at the top and at the bottom of the iridium crucible 100 are measured using optical pyrometers (not shown) through access holes 108 and 109 formed in the top and bottom portions of the thermal insulation 106 so that the seed temperature and the source material temperature, respectively, can be monitored and controlled.

Furnace vessel 110 is made of fused quartz. Furnace vessel 110 is air-cooled or water-cooled. During a PVT growth using an iridium crucible 100 within a PVT growth furnace, a finite gap 111 between the iridium crucible body 101 and the iridium crucible lid 102a is maintained so that at least a portion of Zn vapor may leak out of the iridium crucible 100 and thus a ZnO crystal boule is grown without touching the crucible body 101. Alternatively, the crucible body 101 and the lid 102a can be maintained substantially sealed during a PVT growth so that no significant amount of Zn vapor leaks out of the iridium crucible and thus a ZnO crystal boule is grown while touching the crucible body 101.

Figure 3:
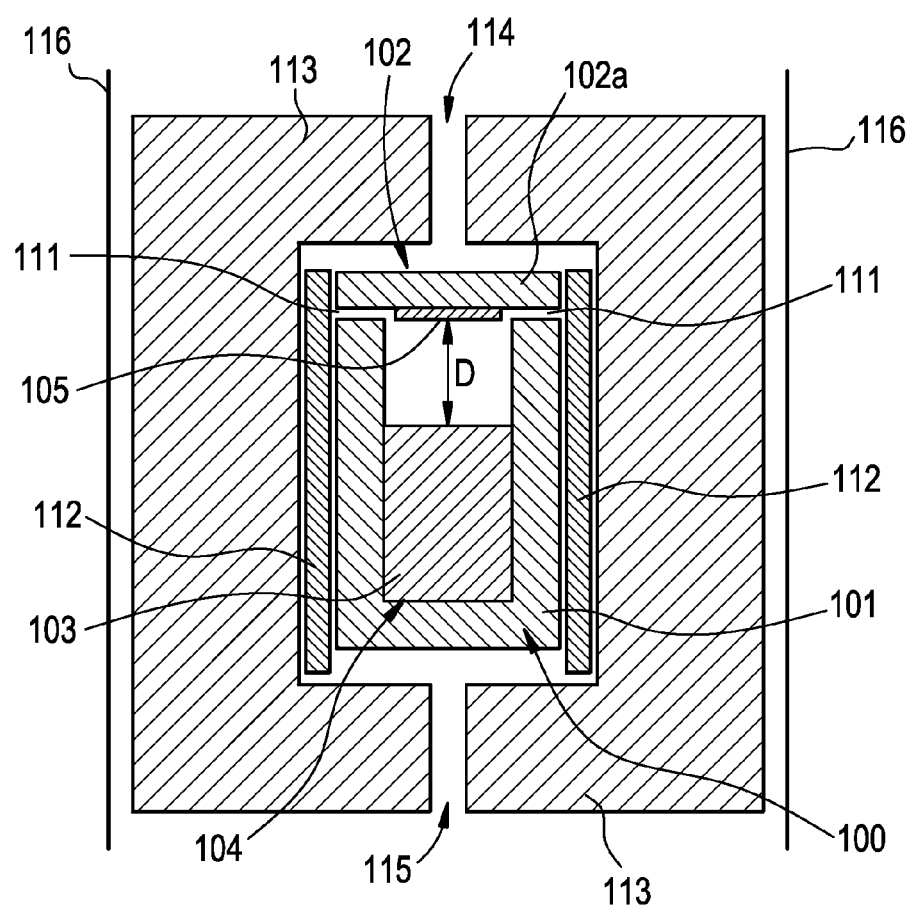
FIG. 3 is a schematic drawing of a ZnO PVT growth setup (the "hot zone") using an iridium crucible within a resistively heated furnace.

Alternatively, a resistively heated furnace can be used, in which a separate iridium heater is used. FIG. 3 illustrates a design of a "hot zone" when a resistively heated furnace is used. In this embodiment, the iridium crucible 100 having a crucible body 101 and a lid 102a has the ZnO source material 103 placed in the second end 104 of the crucible, and a ZnO seed 105 placed in the first end 102, e.g., the lid 102a. The crucible assembly (101 and 102) is surrounded by a resistive heater 112 made of iridium metal. The crucible 100 and resistive heater 112 is then surrounded by a thermal insulation 113 made of refractory metal oxide materials.

The temperatures at the top and at the bottom of the iridium crucible 100 are measured using optical pyrometers (not shown) through access holes 114 and 115 respectively, which are made in the top and bottom portions of the thermal insulation 113. The seed temperature and the source material temperature are monitored through access holes 114 and 115, respectively, and controlled.

As in the inductively heated furnace, examples of metal oxide materials for making the thermal insulation surrounding the iridium heater are $Al_2O_3$-fiber-based thermal insulation materials (such as Type Sali-2, Type Sali, Alumina Mat, all made by Zircar Ceramics, Inc., Florida, NY, USA), $Al_2O_3$ powder, $ZrO_2$ powder, $Y_2O_3$ powder. A "hot zone" made with these insulation materials is suitable for a PVT growth of ZnO crystals in an inert gas (e.g., Ar, $N_2$, He) or an oxygen-containing gas (e.g., $O_2$, air) environment at a temperature of up to 1900° C.

Still referring to FIG. 3, a furnace vessel 116 is made of fused quartz or metal. Furnace vessel 116 is air-cooled or water-cooled. During a PVT growth using an iridium crucible 100 within a PVT growth furnace, a finite gap 111 between the iridium crucible body 101 and the iridium crucible lid 102a may be maintained so that at least a portion of Zn vapor leaks out the iridium crucible 100 and thus a ZnO crystal boule is grown without touching the crucible body 101. Alternatively, the iridium crucible body 101 and iridium crucible lid 102a can be maintained substantially sealed during a PVT growth so that no significant amount of Zn vapor leaks out of the iridium crucible 100 and thus a ZnO crystal boule is grown while touching the crucible body 101.

The procedure for growing a ZnO single crystal boule using an iridium crucible and a thermal insulation in a PVT furnace system includes placing the ZnO source material 103 inside one end 104 of an iridium crucible 100 and placing a ZnO seed 105 at another end 102 of the iridium crucible in such way that the ZnO seed 105 and the surface 103a of the ZnO source material 103 facing the ZnO seed are separated by the first distance D. The iridium metal crucible 100 containing the ZnO seed 105 and the ZnO source material 103 are placed in a thermal insulation setup, such as, for example, a furnace vessel 110, 116 having thermal insulation 106, 113.

The iridium crucible 100 containing the ZnO seed 105 and the ZnO source material 103 is heated in such a way that the temperature of the ZnO source material is higher than the temperature of the ZnO seed. The pressure of the interior of the PVT furnace system is maintained by flowing a gas mixture through the interior of the furnace system and the temperature distribution between the ZnO source material 103 and the ZnO seed 105 is maintained to cause growth of the ZnO single crystal boule on the ZnO seed.

The ZnO source material is a solid material, either in the form of powder or in pieces, e.g., "chunks". The predetermined distance D between the surface of the seed and the surface of the ZnO source material is generally larger than about five millimeters (5 mm).

The heating method is inductive heating when an inductively heated furnace is used or resistive heating when a resistively heated furnace is used. As discussed above, the temperatures at both ends of the crucible may be monitored. To monitor the temperatures, it is contemplated to utilize an optical pyrometer to monitor and control the temperature of the upper end of the iridium crucible through the hole made in the thermal insulation so that the temperature of the ZnO seed 105 ($T_2$) can be monitored and controlled. Another optical pyrometer maybe used to monitor and control the temperature of the lower end of the iridium crucible through the hole, such as access holes 114, 115 made in the thermal insulation so that the temperature of the ZnO source material ($T_1$) can be monitored and controlled.

The pyrometer measurements allow a user to set the temperatures of the ZnO seed 105 and the ZnO source material 103 in such way that the temperature of the ZnO source material ($T_1$) is higher than the temperature of the ZnO seed ($T_2$) to allow a PVT growth of ZnO crystal to occur on the ZnO seed. During a PVT growth of ZnO single crystal, the ZnO source temperature ($T_1$) is set and controlled at a value in the range of 1600-1900° C. The ZnO seed temperature ($T_2$) is in the range from about 1500° C. to about 1900° C. The temperatures of the ZnO source material 103 and the ZnO seed 105 are controlled in such way so that the temperature of the ZnO source 103 ($T_1$) is higher than the temperature of the ZnO seed 105 ($T_2$) by the amount in a range of about 5° C. to about 200° C.

Since the gas pressure inside a PVT growth furnace system has a strong effect on the growth rate of ZnO crystals, the system gas pressure should be maintained in order to achieve a desired growth rate. The system gas pressure can be maintained by flowing a gas or a gas mixture through the interior of the system. Examples of gases that can be used in a PVT ZnO growth are Ar, $N_2$, $O_2$, He, Air, and $CO_2$. Generally speaking, a higher system gas pressure in a PVT growth process leads to a lower growth rate, or vice versa. For a PVT growth of ZnO using this invention, the system gas pressure is maintained at a value in a range of about 0.1 torr to about 1500 torr.

The ZnO seed 105 for a PVT growth is a ZnO single crystal orientated in a specific crystallographic direction. To grow a ZnO single crystal boule for making (0001) ZnO wafers of either on-axis or off-axis by a few degrees, it is desirable to use a ZnO seed close to (0001) orientation. When a (0001) ZnO seed is used, a ZnO crystal boule can be grown on the zinc face (Zn-face) or the oxygen face (O-face). A ZnO seed of an orientation other than (0001) can be used to grow a ZnO single crystal boule. The examples of the other orientations include, (11-20), i.e., a-plane, (1-100), i.e., m-pane, and (11-22), etc. ZnO seed crystals can be grown using a PVT growth technique, a hydrothermal technique, a melt growth technique, or a CVT growth technique. A ZnO PVT growth process is self-sustaining when ZnO seed crystals are generated from the same PVT growth process.

Another feature of this invention is that crystal expansion can be achieved in a PVT growth. A crystal expansion is achieved when a ZnO single crystal boule has a single crystal area larger than the area of the ZnO seed used for the boule growth.

ZnO single crystals produced in a PVT growth process using methods and materials discussed herein can be n-type or p-type with a room-temperature resistivity in the range of $10^{-4}$-$10^{10}$ Ω-cm depending on growth conditions, background impurities, intentional doping type and concentrations. There are three kinds of ZnO wafers desirable for fabrication devices. For fabrication of some semiconductor devices, such as light emitting diodes (LEDs) and laser diodes (LDs), it is desirable to use a substrate of n-type conduction with a low resistivity (e.g., less than 0.1 Ω-cm) or a substrate of p-type conduction with a low resistivity (e.g., less than 0.1 Ω-cm). For other devices, such as radio-frequency (RF) devices and microwave devices, it is desirable to use a semi-insulating (SI) or insulating substrate with a resistivity higher than $1\times10^4$ Ω-cm.

Yet another feature of this invention is to produce ZnO single crystal boules that yield ZnO wafers of any these three kinds. One way to produce an n-type ZnO crystal boule with a low resistivity is to dope the crystal with an n-type dopant, such as B, Al, Ga, In, F, Cl, Br, I, C, Si, Ge, Ti, during a PVT growth. Similarly, one way to produce a p-type ZnO crystal boule with a low resistivity is to dope the crystal with a p-type dopant, such as N, P, As, Sb, Na, K, Cu, and Ag, during a PVT growth.

A way to produce a SI or insulating ZnO crystal boule is to grow a ZnO crystal with very low residual electrically active impurities. This can be achieved by using an ultra-high purity (e.g., 99.999% or higher) ZnO source materials and a highly purified iridium metal crucible. If the residual electrically active impurities still cause the resistivity of the ZnO crystals to be too low to be semi-insulating, one can dope a small amount of a dopant opposite type to compensate the residual impurities so that a SI ZnO single crystal boule can be produced in a PVT growth process using this invention.

Alternatively, one can dope ZnO single crystal wafers through a diffusion process or an ion implantation process followed by a high-temperature thermal anneal or a rapid thermal anneal (RTA) procedure. The diffusion process, the thermal anneal or RTA process should be carried out in an oxygen-containing gas environment so that the stoichiometry of ZnO is strictly preserved to prevent generation of oxygen vacancies.

Another feature of the subject matter disclosed herein is a ZnO wafer made from a ZnO single crystal boule grown via a PVT growth as described above, which can be thermally annealed at a temperature in the range of 600-1400° C. under an oxygen gas or an oxygen-containing gas mixture at an oxygen partial pressure higher than 100 torr to restore the small deviation from the exact stoichiometry of ZnO. This step is usually conducted for a duration of at least 20 minutes. Such a thermal anneal can produce ZnO wafers with a stable resistivity. In one embodiment, the ZnO wafer has an average dislocation density less than $1 \times 10^5$ cm$^{-2}$.

The ZnO wafer may be intentionally doped with at least one p-type dopant to form a ZnO wafer having a p-type conduction and a resistivity less than 0.1 Ω-cm. The p-type dopant is selected from N, P, As, Sb, Na, K, Cu, Ag, or combinations thereof, and the wafer is doped through diffusion at a temperature in a range from about 600° C. to about 1400° C. in an oxygen-containing gas environment at an oxygen partial pressure at or greater than 100 torr.

In another embodiment, a ZnO wafer may be intentionally doped with at least one p-type dopant as described above to form a ZnO wafer having a resistivity greater than $1 \times 10^4$ Ω-cm. The ZnO wafer is doped through diffusion at a temperature in a range from about 600° C. to about 1400° C. in an oxygen-containing gas environment at an oxygen partial pressure at or greater than 100 torr, the.

Alternatively, a ZnO wafer may be intentionally doped with at least one n-type dopant selected from B, Al, Ga, In, F, Cl, Br, I, C, Si, Ge, Ti, Sn or combinations thereof, to form a ZnO wafer having an n-type conduction and a resistivity less than 0.1 Ω-cm. In this embodiment the ZnO wafer is doped through diffusion at a temperature in a range from about 600° C. to about 1400° C. in an oxygen-containing gas environment at an oxygen partial pressure at or greater than 100 torr.

In another example, a ZnO wafer may be intentionally doped with at least one p-type dopant selected from N, P, As, Sb, Na, K, Cu, Ag or combinations thereof, to form a ZnO wafer having a p-type conduction and a resistivity less than 0.1 Ω-cm. The ZnO wafer is doped through ion implantation followed by a thermal anneal at a temperature in a range from about 600° C. to about 1400° C. in an oxygen-containing gas environment at an oxygen partial pressure at or greater than 100 torr.

A further example includes a ZnO wafer intentionally doped with at least one p-type dopant selected from N, P, As, Sb, Na, K, Cu, Ag, or combinations thereof, to form a the ZnO wafer having a resistivity greater than $1 \times 10^4$ Ω-cm. The ZnO wafer is doped through ion implantation followed by a thermal anneal at a temperature in a range from about 600° C. to about 1400° C. in an oxygen-containing gas environment at an oxygen partial pressure at or greater than 100 torr.

Another example of a intentionally doped ZnO wafer includes doping the ZnO wafer with at least one n-type dopant selected from B, Al, Ga, In, F, Cl, Br, I, C, Si, Ge, Ti, Sn or combinations thereof. The formed ZnO wafer has an n-type conduction and a resistivity less than 0.1 Ω-cm. The ZnO wafer is doped through ion implantation followed by a thermal anneal at a temperature in a range from about 600° C. to about 1400° C. in an oxygen-containing gas environment at an oxygen partial pressure at or greater than 100 torr.

ZnO single crystal boules grown using this invention may be further sliced into wafers. The wafers may be polished to make ZnO substrates. A ZnO substrate is suitable for epitaxial growth of thin films and device fabrication.

Thin films that can be grown on ZnO substrates are metal-oxide compounds, which include, but are not limited to, ZnO, CdO, MgO, BeO, $Zn_xMg_{1-x}O$ (where 0<x<1), $Zn_xCd_{1-x}O$ (where 0<x<1), $Zn_xBe_{1-x}O$ (where 0<x<1), and III-nitride compounds, including but not limited to, GaN, InN, AlN, $In_xGa_{1-x}N$ (where 0<x<1), $Al_xGa_{1-x}N$ (where 0<x<1).

A thin film grown on a ZnO substrate can be in a form of a contiguous single-layer single crystal film, or a multi-layer single crystal thin film, or a quantum well structure, or a nano-structure, or a mixture thereof. Semiconductor devices that can be made using thin films of metal oxides or III-nitrides grown on ZnO substrates include, but are not limited to, light emitters, such as UV, visible light emitting diodes (LEDs) and laser diodes (LDs), UV photodetectors, high-frequency/RF devices, such as high electron mobility transistors (HEMTs), high-power devices, such as Schottky diodes, PIN diodes, high-power transistors, high-temperature devices, spintronic devices, radiation detector devices, chemical sensors, surface acoustic devices, and integrated circuits (ICs), and the like.

EXAMPLES

Example 1

ZnO PVT growth experiments in Example 1 (Example 1A through Example 1E) described hereafter were carried out under a nitrogen gas ($N_2$, purity of greater than 99.99%) for controlling the system pressure of the PVT growth furnace. The nitrogen gas flow rates in all these examples were in the range of 500-800 sccm.

The crucible and the lid used in the growth experiments were made with iridium metal of a nominal purity of 99.8%. The iridium crucible is 34 mm in outer diameter and 76 mm in length and weighs 393.8 g. The iridium crucible was annealed for 10 hrs at about 1700° C. under a low vacuum of about 0.5 torr prior to use in the ZnO PVT crystal growth experiments.

ZnO source material was commercial ZnO powder of 99.9% purity and −200 mesh. The ZnO powder was packed and sintered in an alumina crucible (99.8%) at about 1450-1525° C. in air (nominally 760 torr) in a resistively heated furnace for about 20 hrs. The sintered ZnO became solid rods with densities in the range of 4.0-5.3 g/cm$^3$. The sintered ZnO solids were further crushed into solid chunks 2-12 mm in size. The solid chunks were then used as source material for ZnO PVT crystal growth experiments described hereafter.

For growth of Ga-doped n-type ZnO crystals, a small amount of $Ga_2O_3$ of 99.99% purity was mixed with the ZnO powder before sintering. The concentrations of $Ga_2O_3$ added into the ZnO powder were in the range of 0.01% by weight. The amount of ZnO source material used in a PVT growth experiment was in the range of 70-100 g. All the ZnO PVT growths in Example 1 were performed in an induction heated PVT furnace system.

Example 1A

Growth Experiment

This PVT growth experiment was a seeded growth of ZnO single crystal boule using a ZnO single crystal as seed. The ZnO seed crystal was grown using a hydrothermal growth technique and was purchased commercially. The ZnO seed crystal had a dimension of 20×20×1.0 mm³ and it was polished on Zn-face.

PVT ZnO crystal growth took place on Zn-face of the seed crystal. Growth parameters used in this PVT growth experiment are listed in Table 1.

A ZnO single crystal boule of about 27 mm in diameter and about 11 mm in total length was obtained from this growth experiment. The average growth rate of the ZnO crystal was 0.5 mm/hr. The maximum single crystal area in this ZnO crystal boule was about 24 mm in diameter. The ZnO crystal boule was in a light amber color and transparent. The ZnO crystal boule was grown without touching the crucible wall and readily retrieved from the iridium crucible.

TABLE 1

List of growth parameters for the ZnO PVT crystal growth for Example 1A.

| Growth Parameters | Parameter Values |
| --- | --- |
| ZnO source temperature (° C.) | 1695 |
| ZnO seed temperature (° C.) | 1665 |
| Source-seed distance (mm) | 25 |
| System gas pressure - $N_2$ (torr) | 150 |
| Growth time (hrs) | 20 |

Example 1B

Growth Experiment

This PVT growth experiment was a seeded growth of ZnO single crystal boule using a ZnO single crystal as seed. The ZnO seed crystal had a dimension of 27 mm in diameter and 1.1 mm in thickness. The ZnO seed crystal was a ZnO wafer sliced from a PVT ZnO crystal boule grown in-house at Fairfield Crystal Technology and was polished on Zn-face. PVT ZnO crystal growth took place on Zn-face of the seed crystal.

Growth parameters used in this PVT growth experiment are listed in Table 2.

A ZnO single crystal boule of about 27 mm in diameter and about 11.2 mm in total length was obtained from this growth experiment. The average growth rate of the ZnO crystal was 1.02 mm/hr. The maximum single crystal area in this ZnO crystal boule was about 18 mm in diameter. The ZnO crystal boule was in a light amber color and transparent. This ZnO crystal boule was grown in touch with the crucible wall and therefore was separated from the crucible with a mechanical means.

TABLE 2

List of growth parameters for the ZnO PVT crystal growth for Example 1B.

| Growth Parameters | Parameter Values |
| --- | --- |
| ZnO source temperature (° C.) | 1725 |
| ZnO seed temperature (° C.) | 1675 |
| Source-seed distance (mm) | 25 |
| System gas pressure - $N_2$ (torr) | 150 |
| Growth time (hrs) | 10 |

Example 1C

Growth Experiment

This PVT growth experiment was a seeded growth of ZnO single crystal boule using a ZnO seed crystal. The ZnO seed crystal was a PVT ZnO single crystal boule grown in-house at Fairfield Crystal Technology. The seed crystal had a dimension of 27 mm in diameter and 0.8 mm in thickness and was used as-grown, i.e. without further polishing. The as-grown surface of the ZnO seed crystal was Zn-face. ZnO crystal growth took place on the as-grown surface of the seed crystal.

Growth parameters used in this PVT growth experiment are listed in Table 3.

A ZnO single crystal boule of about 27 mm in diameter and about 16 mm in total length was obtained from this growth experiment. The average growth rate of the ZnO crystal was 0.48 mm/hr. The maximum single crystal area in this ZnO crystal boule was about 18 mm in diameter. The ZnO crystal boule was in a light-amber color and transparent. The ZnO crystal boule was grown without touching the crucible wall and was readily retrieved from the iridium crucible.

TABLE 3

List of growth parameters for the ZnO PVT crystal growth for Example 1C.

| Growth Parameters | Parameter Values |
| --- | --- |
| ZnO source temperature (° C.) | 1695 |
| ZnO seed temperature (° C.) | 1660 |
| Source-seed distance (mm) | 20 |
| System gas pressure - $N_2$ (torr) | 150 |
| Growth time (hrs) | 10 |

Example 1D

Growth Experiment

This PVT growth experiment was a seeded growth of a ZnO single crystal boule with a Ga-doped ZnO source material. The intent was to produce a Ga-doped n-type ZnO crystal boule. The ZnO seed crystal had a dimension of 27 mm in diameter and 0.5 mm in thickness. The ZnO seed crystal was a ZnO wafer sliced from a PVT ZnO crystal boule grown in-house at Fairfield Crystal Technology and was polished on Zn-face. PVT ZnO crystal growth took place on Zn-face of the seed crystal.

Growth parameters used in this PVT growth experiment are listed in Table 4.

A ZnO single crystal boule of about 27 mm in diameter and about 7 mm in total length was obtained from this growth experiment. The average growth rate of the ZnO crystal was 0.65 mm/hr. The ZnO crystal boule was in a blue color and transparent. This ZnO crystal boule was grown in touch with the crucible wall and therefore was separated from the crucible with a mechanical means.

TABLE 4

List of growth parameters for the ZnO PVT crystal growth for Example 1D.

| Growth Parameters | Parameter Values |
| --- | --- |
| ZnO source temperature (° C.) | 1695 |
| ZnO seed temperature (° C.) | 1665 |

TABLE 4-continued

List of growth parameters for the ZnO PVT crystal growth for Example 1D.

| Growth Parameters | Parameter Values |
|---|---|
| Source-seed distance (mm) | 25 |
| System gas pressure - $N_2$ (torr) | 150 |
| Growth time (hrs) | 10 |

Example 1E

Growth Experiment

This PVT growth experiment was to produce a multi-grain ZnO crystal boule by growing ZnO crystals directly onto an iridium lid. There was not a seed ZnO seed used in this PVT growth experiment. Growth parameters used in this PVT growth experiment are listed in Table 5. A ZnO crystal boule of about 27 mm in diameter and 8 mm in total length was obtained from this growth experiment. The average growth rate of the ZnO crystal was 0.8 mm/hr. The ZnO crystal boule was in a light amber color and transparent. The ZnO crystal boule contains many single-crystal grains and the maximum size of the single-crystal grains is about 6×8 $mm^2$ in area. This ZnO crystal boule was grown without touching the crucible wall and therefore was separated readily from the crucible.

TABLE 5

List of growth parameters for the ZnO PVT crystal growth for Example 1E.

| Growth Parameters | Parameter Values |
|---|---|
| ZnO source temperature (° C.) | 1665 |
| Ir lid temperature (° C.) | 1625 |
| Source-lid distance (mm) | 20 |
| System gas pressure - $N_2$ (torr) | 200 |
| Growth time (hrs) | 10 |

Crystal Characterization

ZnO crystals obtained from the PVT growth experiments described above and the PVT growth experiments under similar growth conditions disclosed herein were sliced into ZnO samples. ZnO samples were then characterized for material purity, crystalline quality, electrical resistivity, and optical transmission.

Impurity Analysis

Impurities in a ZnO single crystal sample were analyzed using a glow discharge mass spectroscopy (GDMS) and the concentrations (in ppm by weight and the corresponding calculated concentrations in atoms/$cm^3$) of impurities detectable are listed in Table 6 and the rest of the elements in the periodic table (except hydrogen, H, and carbon, C) are below detection limit of this technique. The concentration of lithium (Li) in the ZnO crystal sample is only about $4.4 \times 10^{15}$ $cm^{-3}$, which is about two orders of magnitude lower than the typical Li concentrations found in hydrothermally grown ZnO single crystals ($5 \times 10^{17}$ $cm^{-3}$). Second, the total concentration of known n-type dopants, i.e. B, Al, Cl, Si, Sn, are about $1.7 \times 10^{18}$ $cm^{-3}$. The total concentration of known p-type dopants, i.e. Li, Na, K, P, Sb, are about $9.3 \times 10^{16}$ $cm^{-3}$. The total concentration of n-type dopants is about 20 time of the total concentration of the p-type dopants. As a result, the ZnO crystals had an n-type conductivity. Third, the concentration of calcium (Ca) is $1.1 \times 10^{18}$ $cm^{-3}$ but Ca at this concentration is not an electrically active impurity in ZnO crystals. Fourth, the total concentration of transition metal elements (Ti, Cr, Ni, Fe, Y, W, Ir) is about $3 \times 10^{17}$ $cm^{-3}$. Transition metals in ZnO crystals may be deep level impurities. Finally, the Ir in PVT-grown ZnO crystal was from Ir crucible. Ir is not known to be electrically active in ZnO crystals and it is not expected to affect crystalline quality of ZnO crystals because of its low concentration (at $4.4 \times 10^{16}$ $cm^{-3}$).

The impurities in PVT-grown ZnO single crystals were from three sources: ZnO source material, alumina sintering crucible, and the Ir metal crucible. The impurities in ZnO crystals may be reduced drastically through the following means: (1) Using ZnO source material of higher purity, e.g. 99.999% or better, (2) Using Ir crucibles, instead of an alumina crucible, for sintering and densification of ZnO source powder, and (3) Purifying the Ir metal crucibles before using them for PVT growth of ZnO single crystals or for sintering/densification of ZnO source powder. Reduction of background impurities of PVT-grown ZnO single crystals is used to achieve reliable p-type ZnO with low resistivity and high mobility. Reduction of impurities also help to achieve semi-insulating without compensation in PVT-grown ZnO single crystals.

TABLE 6

Impurities in PVT-grown ZnO crystals detected by GDMS analysis.

| Element | Li | B | Na | Mg | Al | Si | P |
|---|---|---|---|---|---|---|---|
| Concentration (ppm wt.) | 0.009 | 0.58 | 0.13 | 0.1 | 4.2 | 3.5 | 0.17 |
| Concentration (atoms/$cm^3$) | $4.4 \times 10^{15}$ | $1.8 \times 10^{17}$ | $1.9 \times 10^{16}$ | $1.4 \times 10^{16}$ | $5.4 \times 10^{17}$ | $4.2 \times 10^{17}$ | $1.8 \times 10^{16}$ |
| Element | S | Cl | K | Ca | Ti | Cr | Fe |
| Concentration (ppm wt.) | 0.57 | 5.6 | 0.77 | 13 | 0.14 | 1.0 | 0.66 |
| Concentration (atoms/$cm^3$) | $6 \times 10^{16}$ | $5.3 \times 10^{17}$ | $6.6 \times 10^{16}$ | $1.1 \times 10^{18}$ | $9.9 \times 10^{15}$ | $6.5 \times 10^{16}$ | $4 \times 10^{16}$ |
| Element | Ni | Y | Sn | Sb | Ba | W | Ir |
| Concentration (ppm wt.) | 0.18 | 3.8 | 1.2 | 0.28 | 1.3 | 0.2 | 2.5 |
| Concentration (atoms/$cm^3$) | $1 \times 10^{16}$ | $1.4 \times 10^{17}$ | $3.4 \times 10^{16}$ | $7.8 \times 10^{15}$ | $3.2 \times 10^{16}$ | $3.7 \times 10^{15}$ | $4.4 \times 10^{16}$ |

In addition, hydrogen (H) contents in PVT-grown ZnO single crystals were analyzed using a second ion mass spectroscopy (SIMS). It was found that the concentrations of hydrogen in PVT-grown ZnO single crystals are no greater than $1\times10^{17}$ atoms/cm$^3$. Typical concentrations of hydrogen in hydrothermally grown ZnO single crystals are in the range of $5\times10^{17}$ to $5\times10^{18}$ cm$^{-3}$.

Because the concentrations of both Li and H in PVT-grown ZnO single crystals are significantly lower than that in hydrothermally grown ZnO single crystals, the PVT growth method provided in this invention can produce ZnO single crystals of any desirable conduction type and electrical resistivity including the following: (1) a stable n-type with a low resistivity, (2) a stable p-type conduction with a low resistivity (less than 0.1 Ω-cm), and (3) a stable semi-insulating (SI) behavior with a resistivity greater than $1\times10^{4}$ Ω-cm.

Chemical Etching and Etch-Pit Analysis

Chemical etching was used to study dislocations and grain boundaries in PVT-grown ZnO single crystals. ZnO single crystal samples of close to (0001) orientation were polished on oxygen-terminated face, i.e. O-face. Etching was done at room temperature using HCl of 32-34% and the etching duration was about 1 minute. The etched ZnO single crystal samples were examined under an optical microscope and etch-pits corresponding to dislocations approximately parallel to the <0001> axis appeared in a hexagonal shape. Etch-pits were counted and average etch-pit densities (EPDs) were determined Etch-pit density (EPD) is used as a measure of dislocation density in a ZnO crystal sample.

It was found that the average EPDs in PVT-grown ZnO single crystal wafer samples were typically in the range of 200-800 cm$^{-2}$. Some ZnO single crystal samples were found to have average EDPs less than 10 cm$^{-2}$ and majority of the single crystal areas in these samples were etch-pit-free.

Annealing of ZnO Crystals

PVT-grown ZnO crystals were annealed at about 1000-1050° C. in air for about 3-5 hrs. It was found that the color of the as-grown ZnO crystals changed from light amber to colorless. Such annealing was found to alter resistivity and optical transmission of the ZnO crystals, which is described below.

Electrical Resistivity

Electrical resistivity of PVT-grown single crystals was measured using a non-contact Leighton resistivity tool (LEI88). The thickness of ZnO crystal samples was in the range of 0.3-0.6 mm. Three types PVT-grown ZnO crystal samples, i.e., as-grown ZnO crystals without intentional doping (otherwise called undoped ZnO), annealed undoped ZnO, and as-grown Ga-doped ZnO crystals, were examined. The resistivity of undoped ZnO crystals was in the range of 0.5-2.0 Ω-cm. The resistivity of annealed undoped ZnO crystals was in the range of 5-10 Ω-cm. The resistivity of as-grown Ga-doped ZnO crystals was in the range of 0.05-0.1 Ω-cm.

Optical Transmission

Figure 4A:
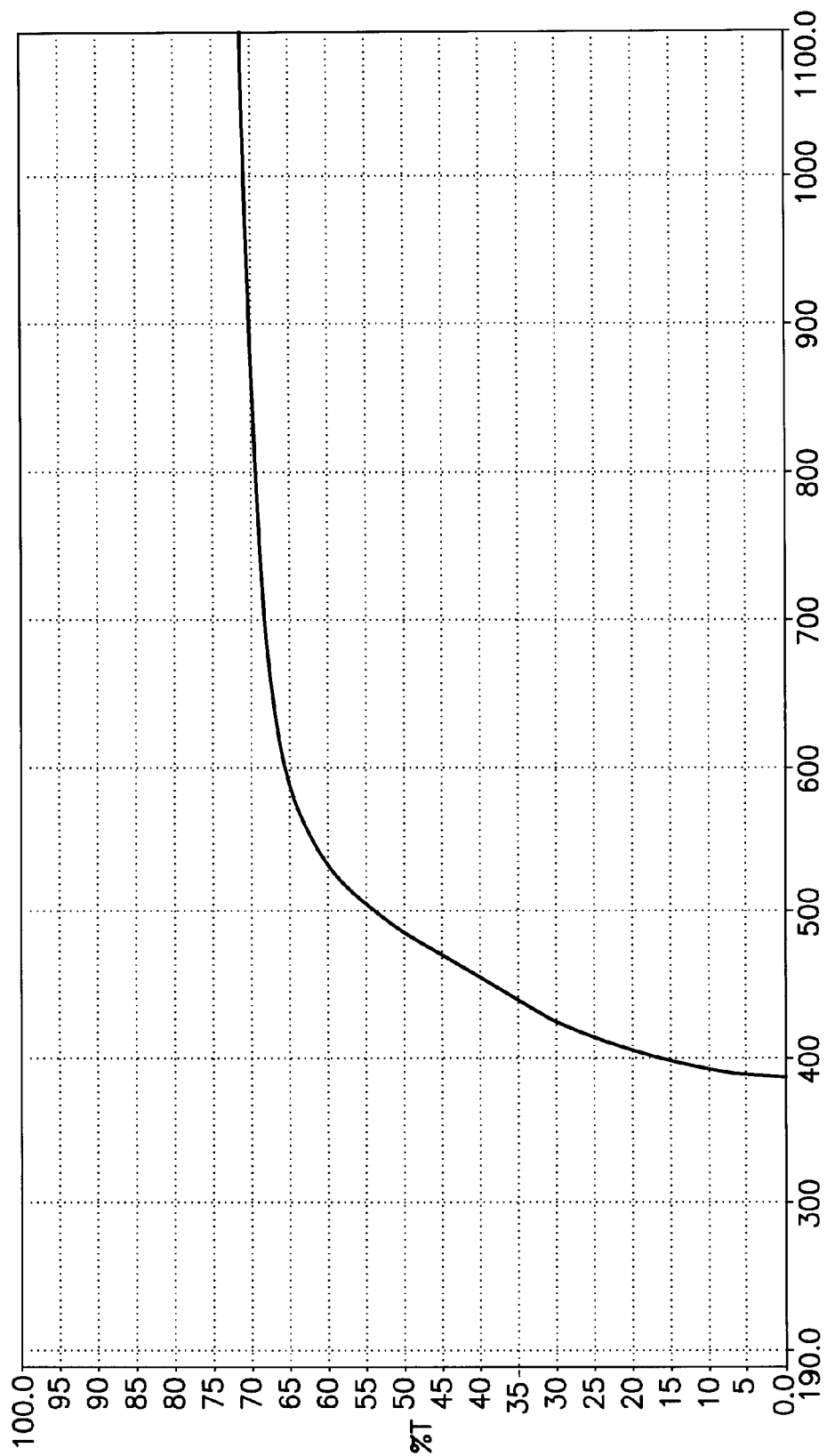
FIG. 4 is an optical transmission spectra of the same polished ZnO wafer of about 0.6 mm in thickness: (a) as-polished, and (b) after high-temperature anneal.
Figure 4B:
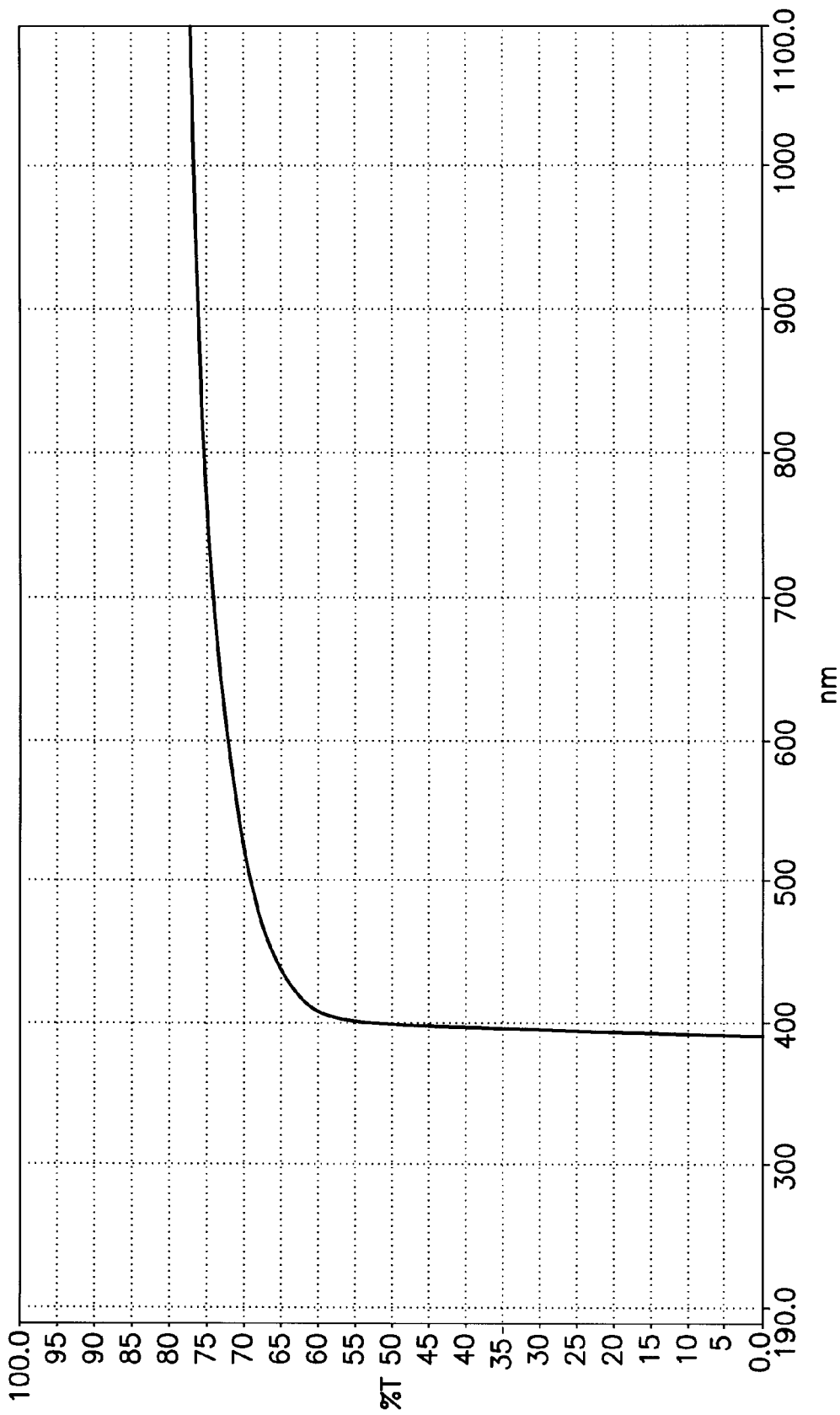

Optical transmission of ZnO crystal samples was measured using a UV-VIS spectrometer (Lambda 25, Perkin Elmer) in the wavelength range of 200 nm-1100 nm. The ZnO crystals examined were double-side-polished and their thicknesses were in the range of 0.5-1.0 mm. Some of the ZnO crystals were also measured after being annealed. FIG. 4 shows two transmission spectra from the same ZnO wafer (a) as-polished, and (b) annealed. It was found that the ZnO crystals had high transmission up to about 76%. The theoretical maximum transmission is about 80% due to the relatively large refractive index of ZnO crystal. The absorption edge was found at about 388 nm and a calculated band gap based on the measured absorption edge was about 3.19 eV. It can be seen by comparing the two transmission spectra, the high-temperature anneal in air improved optical transmission in the wavelength range of 400-1100 nm. The high transmission of PVT-grown ZnO substrates is beneficial to some types of semiconductor devices, such as light emitting diodes (LEDs).

Weight Loss of Iridium Crucible.

Weight loss of the iridium crucible used in ZnO PVT crystal growths under a nitrogen gas pressure of 150-200 torr was analyzed. The weight loss was negligible for each growth under the growth condition substantially similar to that Growth Experiment 1A through Growth Experiment 1E. All the PVT ZnO growths were carried out in an iridium crucible of 34 mm outer diameter and 76 mm in length with an initial crucible weight was 393.8 g.

After 800 hrs of accumulative growth time (only the time period when the crucible was at the growth temperature), the crucible weight was reduced to 379.3 g, i.e. a loss of 14.5 g (about 3.6%). The rate of the iridium loss is averaged at about 0.018 g/hr (i.e., 18 mg/hr). This result shows that iridium crucibles are highly robust in a ZnO HT-PVT crystal growth under an inert gas environment. It is estimated that an iridium crucible can be used in a ZnO PVT growth for more than 8,000 hrs under the ZnO PVT growth conditions delineated in this example. When the weight loss exceeds a certain amount, an iridium crucible may not function normally in the growth process and therefore needs to be replaced. A used iridium crucible can then be re-melted for making another iridium crucible.

ZnO single crystals grown under an inert gas and a mixture of inert gases may deviate from the exact stoichiometry, which results in an oxygen deficiency or a zinc deficiency in the ZnO crystals. PVT-grown ZnO single crystals can be annealed at high temperatures (e.g. about 1000° C.) in $O_2$ or in air to restore stoichiometry in the crystals. By restoring the stoichiometry of the ZnO single crystals, a higher and stable resistivity was resulted and a high optical transmission was obtained.

Example 2

The following ZnO PVT growth experiments (Example 2A through Example 2D) described hereafter were carried out using a pure oxygen gas (greater than 99.99%) or an oxygen-containing gas mixture (e.g. air or a mixture of $O_2$ and $N_2$) for controlling the system pressure of the PVT growth furnace. The nitrogen gas flow rates in all these examples were in the range of 500-800 sccm. The crucible and the lid used in the growth experiments were made with iridium metal of a nominal purity of 99.8%. The iridium crucible is 20 mm in outer diameter and 50 mm in length and weighs 159.3 g. The iridium crucible was annealed for 10 hrs at about 1700° C. under a low vacuum of about 0.5 torr before being used in the ZnO PVT crystal growth experiments. ZnO source material was commercial ZnO powder of 99.9% purity and -200 mesh.

The ZnO powder was packed and sintered in an alumina crucible (99.8%) at about 1450-1525° C. in air (nominally 760 torr) in a resistively heated furnace for about 20 hrs. The sintered ZnO became solid rods with densities in the range of 4.0-5.3 g/cm$^3$. The sintered ZnO solids were further crushed into solid chunks 2-6 mm in size. The solid chunks were then used as source material for ZnO PVT crystal growth experiments described hereafter. The amount of ZnO source material used in PVT growth experiments in Example 2 was in the range of 14-23 g. All the ZnO PVT growths in Example 2 were performed in an induction heated PVT growth furnace system.

Example 2A

Growth Experiment

This growth experiment was a PVT growth of multi-grain ZnO crystal boule under a pure oxygen gas of greater than 99.99% purity. The ZnO crystal boule was grown directly onto an iridium lid and no ZnO crystal seed was used. The growth parameters are listed in Table 7. The ZnO boule obtained from this growth was about 14.5 mm in diameter and 4 mm in length. The average crystal growth rate was 0.8 mm/hr. The boule was grown without touching the crucible wall and therefore was readily separated from the crucible. The ZnO boule was in light yellow-green color and transparent. The largest crystal grain measured about 3×3 mm$^2$.

TABLE 7

List of growth parameters for Example 2A.

| Growth Parameters | Parameter Values |
|---|---|
| ZnO source temperature (° C.) | 1685 |
| Ir lid temperature (° C.) | 1650 |
| Source-lid distance (mm) | 15 |
| System gas pressure - O$_2$ (torr) | 80 |
| Growth time (hrs) | 5 |

Example 2B

Growth Experiment

Growth Experiment 2B was a PVT growth of multi-grain ZnO crystal boule under a gas mixture of 50% O$_2$ gas and 50% N$_2$ gas by volume. Both the O$_2$ and N$_2$ were of a purity greater than 99.99%. The ZnO crystal boule was grown directly onto an iridium lid and no ZnO crystal seed was used. The growth parameters are listed in Table 8. The ZnO boule obtained from this growth was about 14.5 mm in diameter and 7 mm in length. The average crystal growth rate was 1.4 mm/hr. The boule was grown without touching the crucible wall and therefore was readily separated from the crucible. The ZnO boule was in light yellow-green color and transparent. The largest crystal grain measured about 4×5 mm$^2$.

TABLE 8

List of growth parameters for Example 2B.

| Growth Parameters | Parameter Values |
|---|---|
| ZnO source temperature (° C.) | 1665 |
| Ir lid temperature (° C.) | 1635 |
| Source-lid distance (mm) | 15 |
| System gas pressure - 50% O$_2$ + 50% N$_2$ (torr) | 80 |
| Growth time (hrs) | 5 |

Example 2C

Growth Experiment

This growth experiment was a PVT growth of multi-grain ZnO crystal boule under air (e.g., air present in a normal room, which is nominally a mixture of about 19% O$_2$ and about 81% N$_2$. The ZnO crystal boule was grown directly onto an iridium lid and no ZnO crystal seed was used. The growth parameters are listed in Table 9. The ZnO boule obtained from this growth was about 14.5 mm in diameter and 12.5 mm in length. The average crystal growth rate was 0.83 mm/hr. The ZnO boule was grown touching the crucible wall and therefore was separated from the crucible by a mechanical means. The color of the ZnO boule was light-green. The largest crystal grain measured about 2×3 mm$^2$.

TABLE 9

List of growth parameters for Growth Experiment 2C.

| Growth Parameters | Parameter Values |
|---|---|
| ZnO source temperature (° C.) | 1665 |
| Ir lid temperature (° C.) | 1635 |
| Source-lid distance (mm) | 15 |
| System gas pressure - Air (torr) | 200 |
| Growth time (hrs) | 15 |

Example 2D

Example 2D was a PVT growth of multi-grain ZnO crystal boule under air (a room air, nominally a mixture of about 19% O$_2$ and about 81% N$_2$). The ZnO crystal boule was grown using a multi-grain ZnO crystal grown previously as a seed. The growth parameters are listed in Table 10. The ZnO boule obtained from this growth was about 14.5 mm in diameter and 12.5 mm in total length. The average crystal growth rate was 0.43 mm/hr. The boule was grown touching the crucible wall and therefore was separated from the crucible by a mechanical means. The color of the ZnO boule was dark amber. The largest crystal grain measured about 3×4 mm$^2$.

TABLE 10

List of growth parameters for Example 2D.

| Growth Parameters | Parameter Values |
|---|---|
| ZnO source temperature (° C.) | 1675 |
| ZnO seed temperature (° C.) | 1645 |
| Seed dimension (diameter × thickness, mm) | 14.5 × 6.0 |
| Source-seed distance (mm) | 17 |
| System gas pressure - Air (torr) | 200 |
| Growth time (hrs) | 15 |

Weight Loss of the Iridium Crucible

Weight loss of the iridium crucible used in the ZnO PVT crystal growths under a pure oxygen gas or an oxygen-containing gas mixture at a pressure of 150-200 torr was analyzed. After each PVT run of ZnO crystal growth under the growth condition substantially similar to that in Growth Experiment 2A through Growth Experiment 2D, the iridium crucible was found to has a dark-purple-color skin, iridium oxide, on the outside surface. The weight loss of iridium crucible was found to be significant after each growth run.

Analysis showed that, after 258 hrs of accumulative growth time (only the time period when the crucible was at the growth temperature), the crucible weight was reduced from 159.3 g to 101.2 g, i.e. a loss of 58.1 g (about 36%). The rate of iridium loss is averaged at about 0.22 g/hr, which is bout twenty times of the average loss per hour for PVT growths under an inert gas environment described in Example 1. When the weight loss exceeds a certain amount, an iridium crucible may not function normally in the growth process and therefore needs to be replaced. A used iridium crucible can then be re-melted for making another iridium crucible.

While the invention has been described with reference to various exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for growing a zinc oxide (ZnO) single crystal boule within an interior of a physical vapor transport (PVT) furnace system, the method comprising the steps of:
   placing a ZnO source material inside a first end of an iridium metal crucible and placing a ZnO seed in a second end of the iridium metal crucible wherein the ZnO seed and a surface of the ZnO source material facing the ZnO seed are separated by a first distance;
   placing the iridium metal crucible containing the ZnO seed and the ZnO source material in a thermal insulation setup;
   heating the iridium metal crucible containing the ZnO seed and the ZnO source material to obtain a temperature distribution such that a temperature of the ZnO source material ($T_1$), is higher than a temperature of the ZnO seed ($T_2$), wherein $T_2$ is a temperature in a range from about 1500° C. to about 1900° C.;
   maintaining a pressure of the interior of the PVT furnace system by flowing a gas mixture through the interior of the PVT furnace system; and
   maintaining the temperature distribution within the iridium metal crucible to cause growth of the ZnO single crystal boule on the ZnO seed, wherein the ZnO crystal boule comprises lithium (Li) in an atomic concentration less than about $1\times10^{16}$ cm$^{-3}$ and hydrogen (H) in an atomic concentration less than about $1\times10^{17}$ cm$^{-3}$.

2. A method according to claim 1 wherein the thermal insulation setup is made of one or more metal-oxide materials selected from the group consisting of $Al_2O_3$-fiber-based thermal insulation materials, $Al_2O_3$ powder, $ZrO_2$ powder, $Y_2O_3$ powder, MgO powder and combinations thereof.

3. A method according to claim 1, wherein the heating is achieved through induction heating or resistive heating.

4. A method according to claim 1, wherein the first distance between the seed and the surface of the source material facing the seed is greater than 5 mm.

5. A method according to claim 1, wherein $T_1$ is higher than $T_2$ by an amount in the range from about 5° C. to about 200° C.

6. A method according to claim 1, wherein the pressure of the interior of the PVT furnace system is in the range of about 0.1 torr to about 1500 torr.

7. A method according to claim 1, wherein the gas mixture comprises of at least one gas selected from a group nitrogen, argon, oxygen, air, helium, $CO_2$, CO, NO, $NO_2$, and $N_2O$.

8. A method according to claim 1, wherein the ZnO crystal boule is a p-type semiconductor having an electrical resistivity in a range of about 1000 Ω-cm to about 0.0001 Ω-cm.

9. A method according to claim 1, wherein the ZnO crystal boule is an n-type ZnO semiconductor having an electrical resistivity in a range of about 1000 Ω-cm to about 0.0001 Ω-cm.

10. A method according to claim 1, wherein the ZnO single crystal boule has an electrical resistivity of greater than about $1\times10^4$ Ω-cm.

11. A method according to claim 1, further comprising:
    doping the ZnO single crystal boule during the PVT growth with at least one p-type dopant having a p-type conduction and a resistivity less than about 0.1 Ω-cm, the dopant selected from a group consisting of N, P, As, Sb, Na, K, Cu, and Ag.

12. A method according to claim 1, further comprising:
    doping the ZnO single crystal boule during the PVT growth with at least one p-type dopant having a resistivity greater than $1\times10^4$ Ω-cm, the dopant selected from a group of N, P, As, Sb, Na, K, Cu, and Ag.

13. A method according to claim 1, further comprising:
    doping the ZnO single crystal boule during the PVT growth with at least one n-type dopant having an n-type conduction and a resistivity less than 0.1 Ω-cm, the dopant selected from a group of B, Al, Ga, In, F, Cl, Br, I, C, Si, Ge, Ti, and Sn.

14. A method according to claim 1, wherein a growth rate of the ZnO single crystal boule during a physical vapor phase growth is in a range of about 0.2 mm/hr to about 5.0 mm/hr.

15. A method of forming a ZnO wafer made from a ZnO single crystal boule made by a method according to claim 1, the method comprising:
    thermally annealing the ZnO single crystal boule under an oxygen gas or an oxygen-containing gas mixture to form the ZnO wafer, wherein the ZnO wafer has an average dislocation density less than $1\times10^5$ cm$^{-2}$.

16. A method of forming a ZnO wafer according to claim 15, the method further comprising:
    intentionally doping the ZnO wafer with at least one p-type dopant selected from the group consisting of N, P, As, Sb, Na, K, Cu, Ag, and combinations thereof,
    wherein the ZnO wafer is doped through diffusion at a temperature in a range from about 600° C. to about 1400° C. in an oxygen-containing gas environment at an oxygen partial pressure at or greater than 100 torr, the ZnO wafer having a p-type conduction and a resistivity less than 0.1 Ω-cm.

17. A method of forming a ZnO wafer according to claim 15, further comprising:
    intentionally doping the ZnO wafer with at least one p-type dopant selected from the group consisting of N, P, As, Sb, Na, K, Cu, Ag, and combinations thereof,
    wherein the ZnO wafer is doped through diffusion at a temperature in a range from about 600° C. to about 1400° C. in an oxygen-containing gas environment at an oxygen partial pressure at or greater than 100 torr, the ZnO wafer having a resistivity greater than $1\times10^4$ Ω-cm.

18. A method of forming a ZnO wafer according to claim 15, further comprising:
    intentionally doping the ZnO wafer with at least one n-type dopant selected from the group consisting of B, Al, Ga, In, F, Cl, Br, I, C, Si, Ge, Ti, Sn, and combinations thereof,
    wherein the ZnO wafer is doped through diffusion at a temperature in a range from about 600° C. to about 1400° C. in an oxygen-containing gas environment at an oxygen partial pressure at or greater than 100 torr, the ZnO wafer having an n-type conduction and a resistivity less than 0.1 Ω-cm.

19. A method for growing a zinc oxide (ZnO) single crystal boule within an interior of a physical vapor transport (PVT) furnace system, the method comprising the steps of:
- placing a ZnO source material inside a first end of an iridium metal crucible and placing a ZnO seed in a second end of the iridium metal crucible wherein the ZnO seed and a surface of the ZnO source material facing the ZnO seed are separated by a first distance;
- placing the iridium metal crucible containing the ZnO seed and the ZnO source material in a thermal insulation setup;
- heating the iridium metal crucible containing the ZnO seed and the ZnO source material to obtain a temperature distribution such that a temperature of the ZnO source material ($T_1$), is higher than a temperature of the ZnO seed ($T_2$), wherein $T_2$ is a temperature in a range from about 1500° C. to about 1900° C.;
- maintaining a pressure of the interior of the PVT furnace system by flowing a gas mixture through the interior of the PVT furnace system; and
- maintaining the temperature distribution within the iridium metal crucible to cause growth of the ZnO single crystal boule on the ZnO seed, wherein the ZnO single crystal boule has an iridium (Ir) concentration in a range of about 0.5 ppm to about 10 ppm by weight.

* * * * *